(12) United States Patent
Chong et al.

(10) Patent No.: US 6,727,151 B2
(45) Date of Patent: Apr. 27, 2004

(54) METHOD TO FABRICATE ELEVATED SOURCE/DRAIN STRUCTURES IN MOS TRANSISTORS

(75) Inventors: Yung Fu Chong, Singapore (SG); Randall Cher Liang Cha, Singapore (SG); Alex See, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 151 days.

(21) Appl. No.: 10/213,562

(22) Filed: Aug. 7, 2002

(65) Prior Publication Data

US 2004/0029320 A1 Feb. 12, 2004

(51) Int. Cl.⁷ .............................................. H01L 21/336
(52) U.S. Cl. ........................................ 438/300; 438/304
(58) Field of Search ................................. 438/299–307

(56) References Cited

U.S. PATENT DOCUMENTS

| | | | |
|---|---|---|---|
| 5,028,557 A | * 7/1991 | Tsai et al. | 438/202 |
| 5,571,738 A | 11/1996 | Krivokapic | |
| 5,627,395 A | * 5/1997 | Witek et al. | 257/350 |
| 6,090,672 A | 7/2000 | Wanlass | 438/301 |
| 6,133,106 A | 10/2000 | Evans et al. | 438/299 |
| 6,225,173 B1 | 5/2001 | Yu | 438/301 |
| 6,271,132 B1 | 8/2001 | Xiang et al. | 438/682 |
| 6,326,272 B1 | * 12/2001 | Chan et al. | 438/300 |

* cited by examiner

Primary Examiner—Thanh T. Nguyen
(74) Attorney, Agent, or Firm—George O. Saile; Rosemary L. S. Pike

(57) ABSTRACT

A method for forming a MOSFET having an elevated source/drain structure is described. A sacrificial oxide layer is provided on a substrate. A polish stop layer is deposited overlying the sacrificial oxide layer. An oxide layer is deposited overlying the polish stop layer. An opening is formed through the oxide layer and the polish stop layer to the sacrificial oxide layer. First polysilicon spacers are formed on sidewalls of the opening wherein the first polysilicon spacers form an elevated source/drain structure. Second polysilicon spacers are formed on the first polysilicon spacers. The oxide layer and sacrificial oxide layer exposed within the opening are removed. An epitaxial silicon layer is grown within the opening. A gate dielectric layer is formed within the opening overlying the second polysilicon spacers and the epitaxial silicon layer. A gate material layer is deposited within the opening. The gate material layer, first polysilicon spacers and second polysilicon spacers are polished back to the polish stop layer thereby completing formation of a MOSFET having an elevated source/drain structure in the fabrication of an integrated circuit device.

32 Claims, 6 Drawing Sheets

METHOD TO FABRICATE ELEVATED SOURCE/DRAIN STRUCTURES IN MOS TRANSISTORS

BACKGROUND OF THE INVENTION

1. Field of the Invention

The invention relates to the fabrication of integrated circuit devices, and more particularly, to a method of forming an elevated source/drain MOSFET structure in the fabrication of integrated circuits.

2. Description of the Prior Art

Conventional MOS transistors have gates that are of a greater height than the source/drain regions. Hence, during the subsequent contact opening step, the gate suffers from excessive plasma induced damage (PID) because the etching of the pre-metal dielectric will first be completed at the gate before the source/drain regions are exposed. Furthermore, during formation of salicides on the source/drain regions, there is a tendency for the junction to be consumed as junction depths decrease to less than about 100 nanometers. It is desired to solve the dual problems of PID and junction consumption.

A number of workers in the art have proposed elevated source/drain structures. U.S. Pat. No. 6,133,106 to Evans et al discloses source/drain regions and gate of the same height where the gate is formed by a dummy gate replacement method. U.S. Pat. No. 6,271,132 to Xiang et al shows contact regions over the source/drain regions where the contact regions have the same height as the gate. U.S. Pat. No. 5,571,738 teaches short channel FET's with polysilicon source/drains shorter than the gate. U.S. Pat. No. 6,225,173 to Yu and U.S. Pat. No. 6,090,672 to Wanless show damascene gate processes.

SUMMARY OF THE INVENTION

A principal object of the present invention is to provide an effective and very manufacturable method of forming a MOSFET having elevated source/drain structures.

A further object of the invention is to provide a method of forming a MOSFET having an elevated source/drain structure having the same height as the height of the gate electrode.

Yet another object is to provide a method of forming a MOSFET having an elevated source/drain structure having the same height as the height of the gate electrode wherein plasma induced damage to the gate is reduced.

A further object is to provide a method of forming a MOSFET having an elevated source/drain structure having the same height as the height of the gate electrode wherein junction consumption during silicidation is eliminated.

A still further object is to provide a method of forming a MOSFET having an elevated source/drain structure having the same height as the height of the gate electrode wherein plasma induced damage to the gate is reduced and junction consumption during silicidation is eliminated.

In accordance with the objects of this invention a method for forming a MOSFET having an elevated source/drain structure is achieved. A sacrificial oxide layer is provided on a substrate. A polish stop layer is deposited overlying the sacrificial oxide layer. An oxide layer is deposited overlying the polish stop layer. An opening is formed through the oxide layer and the polish stop layer to the sacrificial oxide layer. First polysilicon spacers are formed on sidewalls of the opening wherein the first polysilicon spacers form an elevated source/drain structure. Second polysilicon spacers are formed on the first polysilicon spacers. The oxide layer and sacrificial oxide layer exposed within the opening are removed. An epitaxial silicon layer is grown within the opening. A gate dielectric layer is formed within the opening overlying the second polysilicon spacers and the epitaxial silicon layer. A gate material layer is deposited within the opening. The gate material layer, first polysilicon spacers and second polysilicon spacers are polished back to the polish stop layer thereby completing formation of a MOSFET having an elevated source/drain structure in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
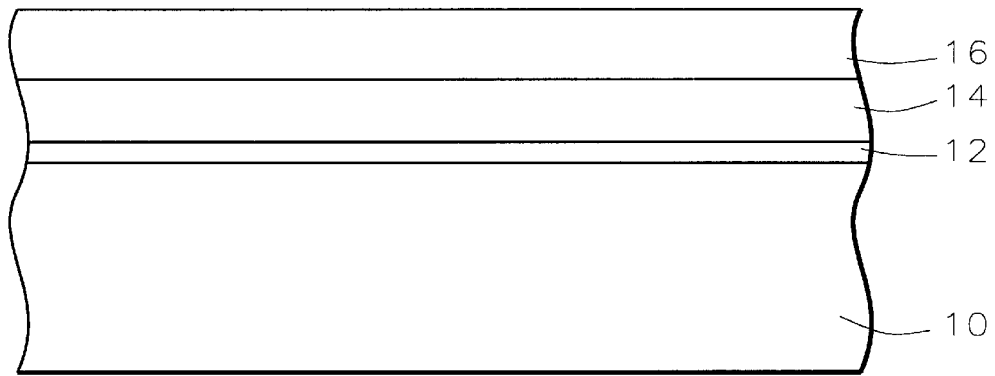
FIGS. 1 through 11 schematically illustrate in cross-sectional representation a preferred embodiment of the present invention.

Referring now more particularly to FIG. 1, there is shown an illustration of a portion of a partially completed metal oxide field effect transistor (MOSFET). The semiconductor substrate 10 is preferably composed of silicon having a (100) crystallographic orientation and has been doped to be a p-type substrate. It will be understood by those skilled in the art that while FIGS. 1 through 12 illustrate an N channel MOSFET integrated circuit device, a P channel FET integrated circuit device could be formed simply by substituting opposite polarities to those given for the N channel embodiment. Also, in a similar way, a CMOSFET could be formed by making both N channel and P channel devices upon the same substrate.

In an effort to simplify the description and the drawings the dielectric isolation between devices has been only partially shown and will not be described in detail, because they are conventional. For example, shallow trench isolation regions, not shown, may be formed in the semiconductor substrate.

Now a film stack will be deposited on the substrate 10. For example, a sacrificial oxide layer 12 is grown or deposited on the surface of the substrate to a thickness of between about 10 and 200 Angstroms. Now, a silicon nitride layer 14 is deposited over the sacrificial oxide layer 12 to a thickness of between about 100 and 1000 Angstroms. Then a silicon oxide layer 16 is deposited over the nitride layer 14 to a thickness of between about 100 and 1000 Angstroms.

Figure 2:
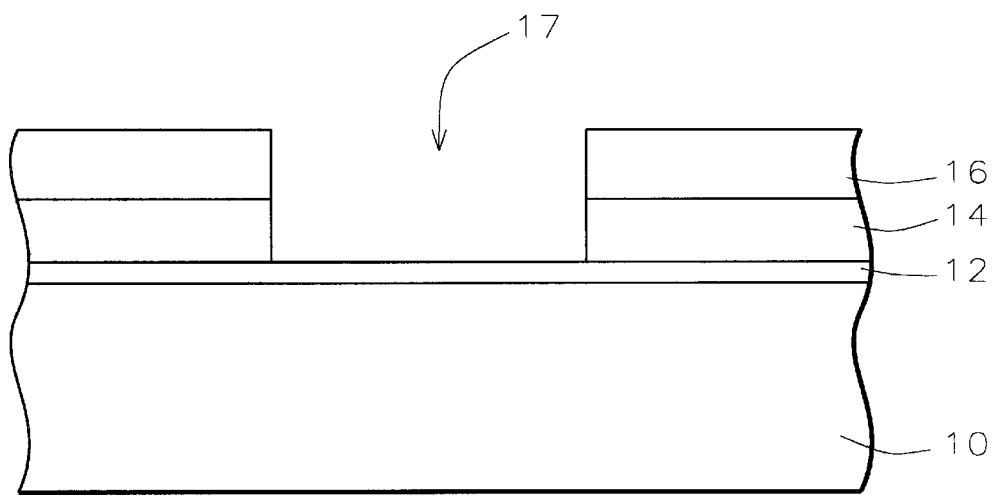

Using conventional lithographic and etching methods, the top oxide 16 and nitride layer 14 are patterned to form an opening 17, as shown in FIG. 2.

Figure 3:
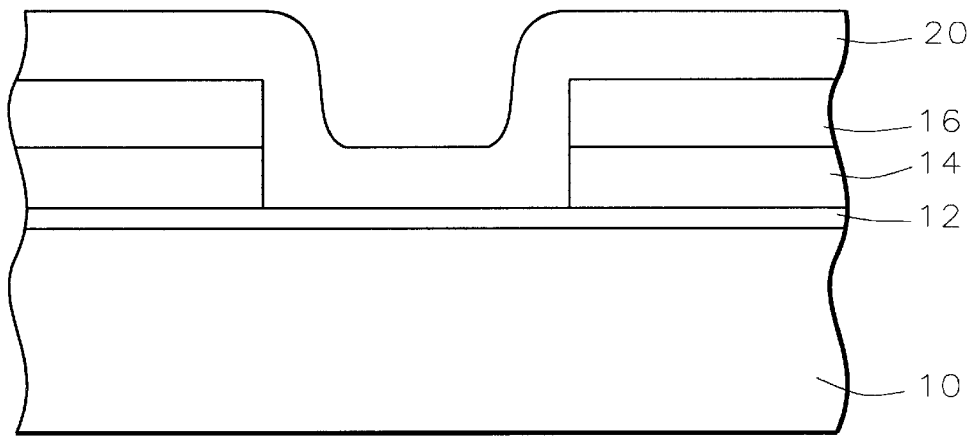

Referring now to FIG. 3, a polysilicon layer 20 is deposited by chemical vapor deposition (CVD) to a selected thickness of between about 80 and 800 Angstroms over the film stack and conformally within the opening 17. This polysilicon layer will be used to form the elevated source/drain regions. The polysilicon layer 20 is doped by ion implantation, followed by rapid thermal annealing (RTA), for example, at a later step to activate the dopants. Alternatively, the polysilicon layer 20 may be in-situ doped. The polysilicon layer can be p or n doped for CMOS fabrication.

Figure 4:
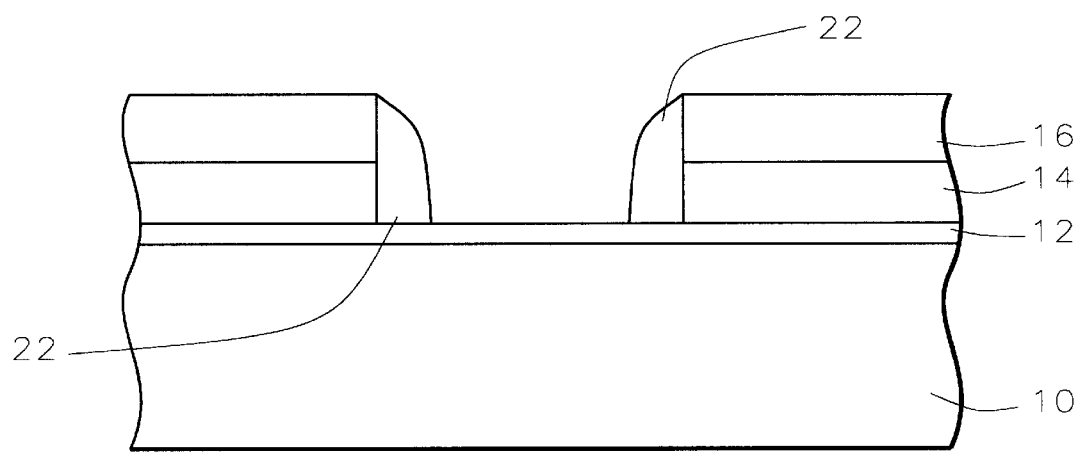

Referring now to FIG. 4, the polysilicon layer 20 is etched back to form self-aligned poly spacers 22. The sacrificial oxide layer 12 acts as an etch stop layer.

Figure 5:
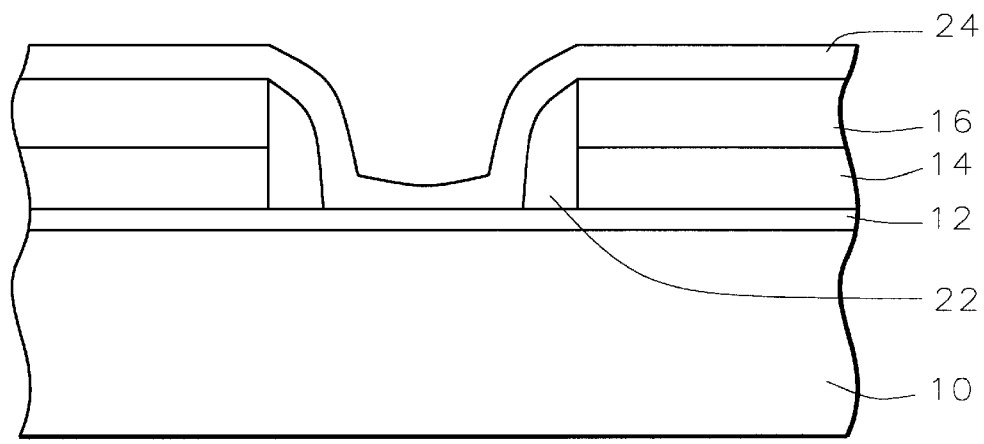

Now a second polysilicon layer 24 is deposited over the film stack, the poly spacers 22, and within the opening 17, as shown in FIG. 5. The polysilicon layer 24 is doped by ion implantation, followed by rapid thermal annealing (RTA), for example, to activate all dopants. Alternatively, the polysilicon layer 24 may be in-situ doped. This polysilicon layer 24 will be used to form the lightly doped source/drain extensions and so should have a lower doping concentration, p or n doped for CMOS fabrication, than the first polysilicon layer.

Figure 6:
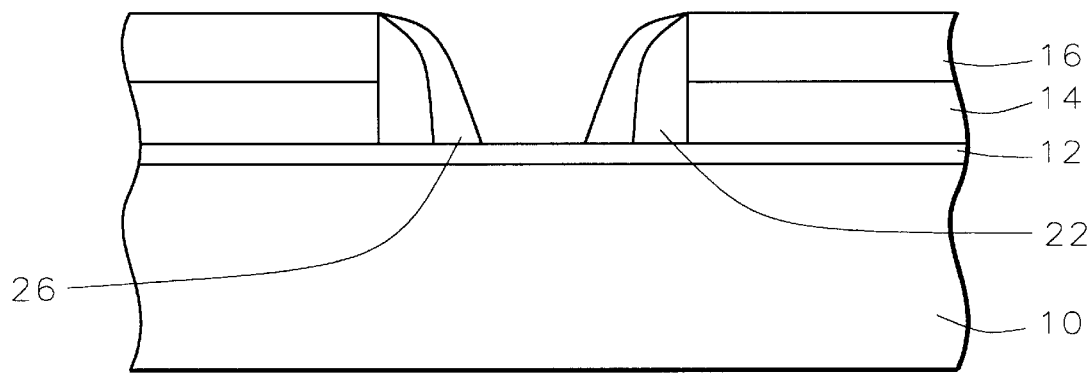

Referring now to FIG. 6, second self-aligned poly spacers 26 are formed by anisotropic etchback of the polysilicon layer 24. Again, the sacrificial oxide layer 12 acts as an etch stop.

Figure 7:
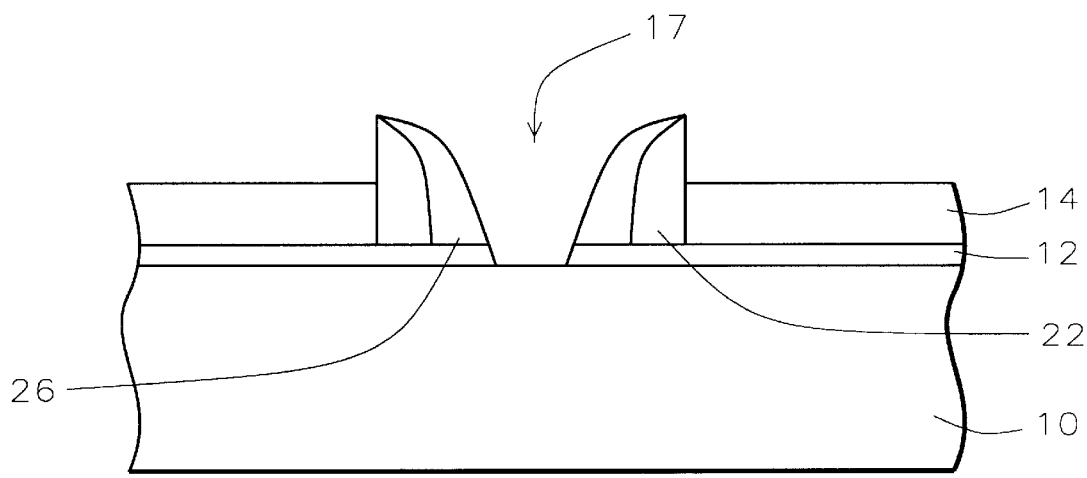

Now the top oxide layer 16 and the sacrificial oxide layer 12 where it is exposed between the second poly spacers 26 are removed, preferably by a wet etch process. This step is to facilitate subsequent chemical mechanical polishing (CMP) of both poly spacers 22 and 26. FIG. 7 illustrates the MOSFET device after removal of the oxide layers.

Figure 8:
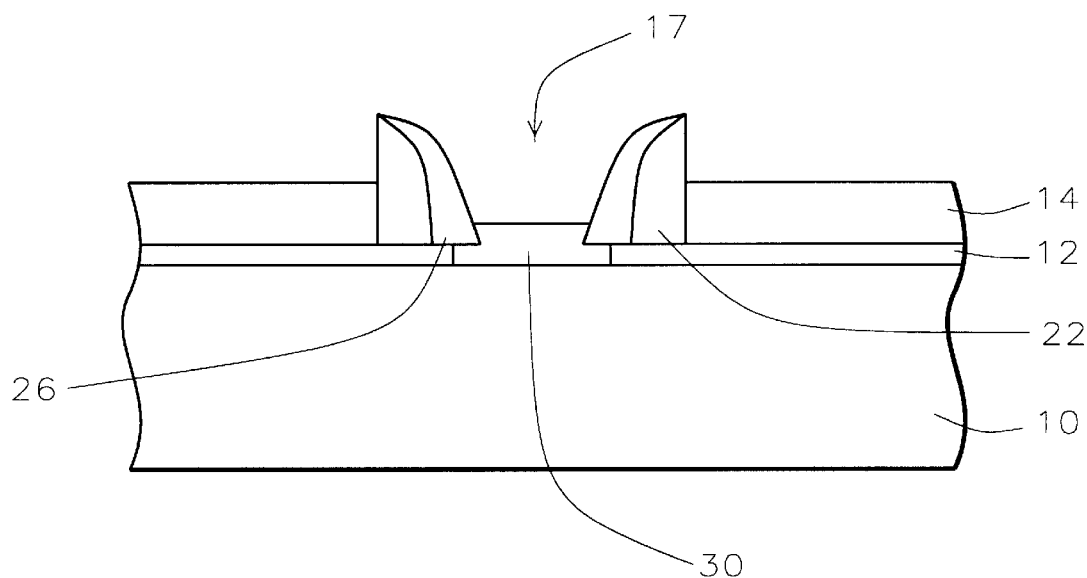

Referring now to FIG. 8, epitaxial silicon growth is performed from the exposed silicon substrate within the opening 17. Note that epitaxial silicon growth will also occur for both poly spacers 22 and 26. In this way, there is an added advantage of forming a shorter channel. The epitaxial silicon layer 30 within the opening 17 is grown to a preferred thickness of between about 10 and 500 Angstroms. The epitaxial silicon layer may now be doped using ion implantation for threshold voltage control. The epitaxial silicon layer will provide high quality crystal to act as a channel the MOS transistor.

Figure 9:
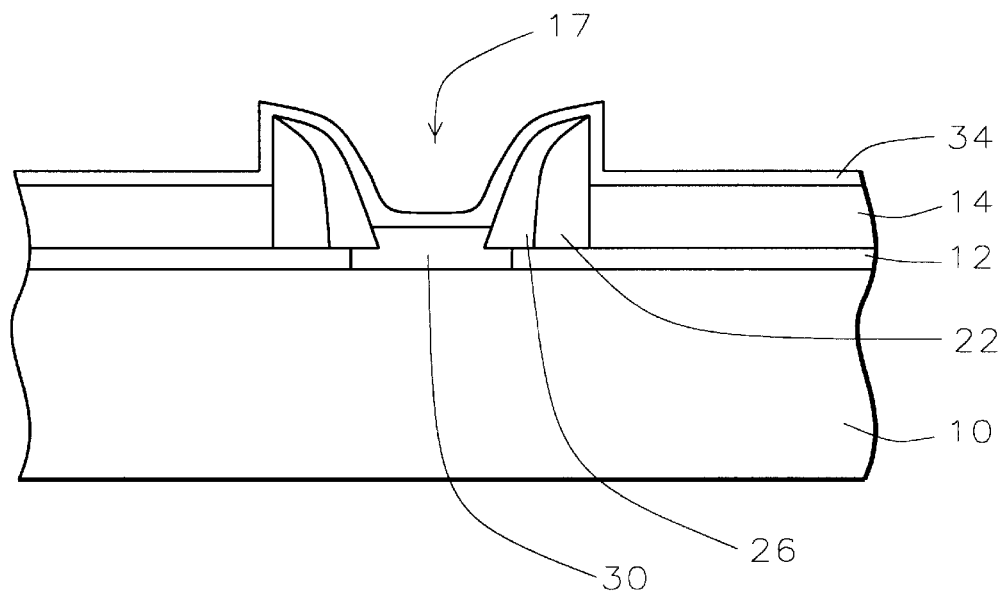

As illustrated in FIG. 9, a gate dielectric layer 34 is deposited over the nitride layer, the poly spacers, and the epitaxial silicon layer. This is preferably a high dielectric constant material layer. Alternatively, silicon dioxide could be thermally grown as the gate dielectric layer 34.

Figure 10:
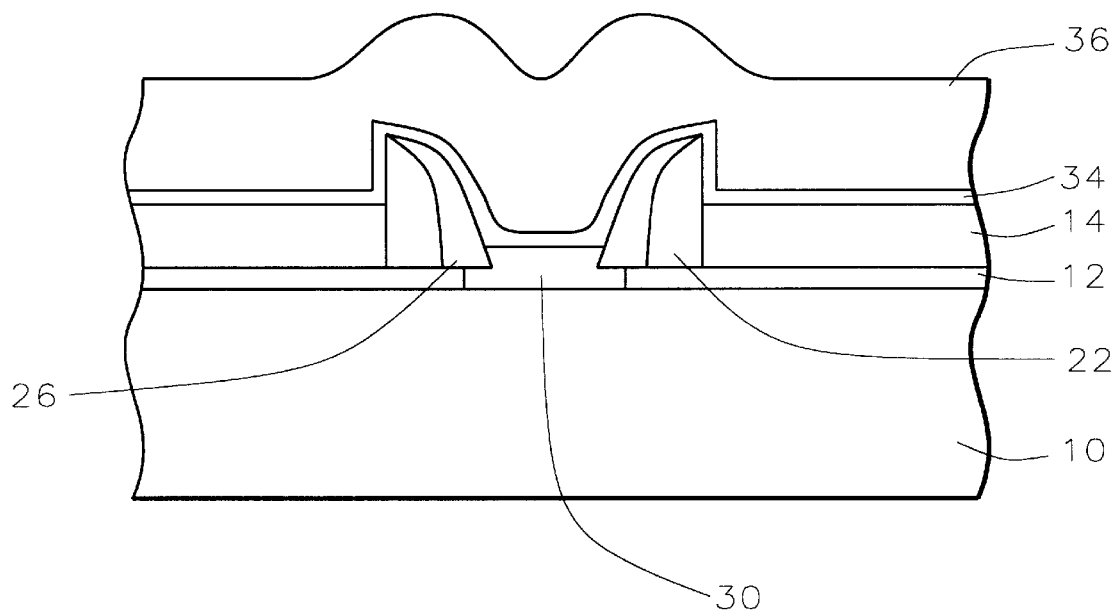
Figure 11:
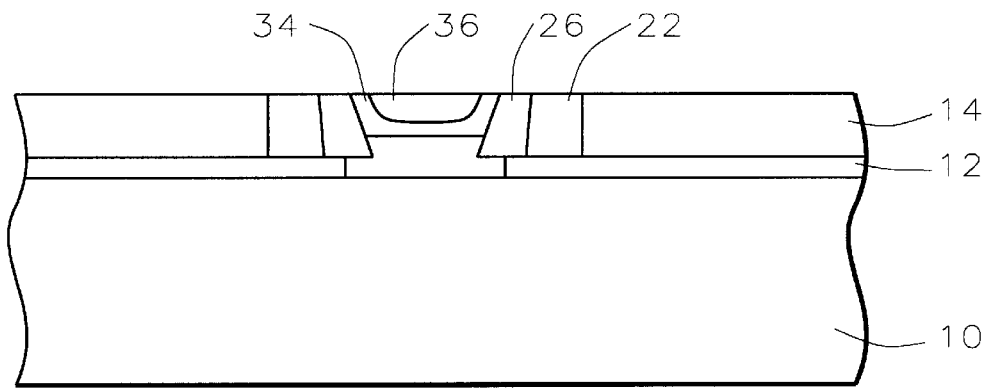

Referring now to FIG. 10, a gate electrode material layer 36 is deposited over the gate dielectric 34. This layer may be in-situ doped polysilicon or a metal. The layers are planarized using CMP where the nitride layer 14 acts as the polish stop, as shown in FIG. 11.

This completes the formation of the MOSFET with elevated source/drain structure. First poly spacers 22 form the source/drain regions while second poly spacers 26 form the lightly doped source/drain extensions. The source/drain junctions may be silicided as shown by 38 in FIG. 12. Because the source/drain junctions are elevated, the problem of junction consumption is eliminated.

Figure 12:
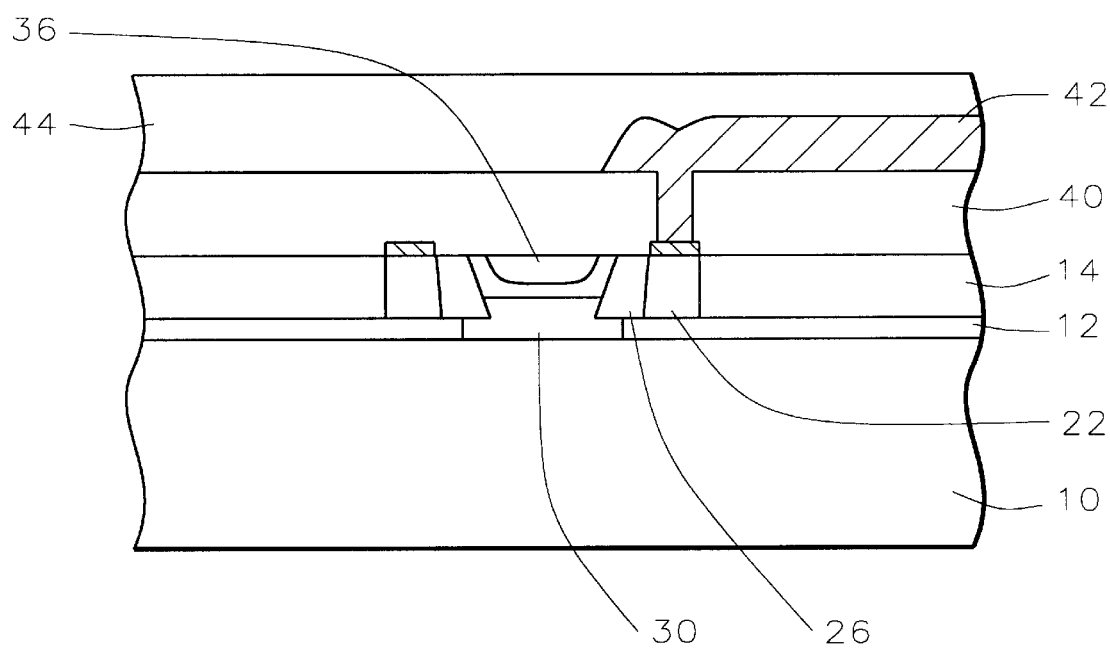
FIG. 12 schematically illustrates in cross-sectional representation a completed integrated circuit device fabricated according to a preferred embodiment of the present invention.

The integrated circuit device is completed as is conventional in the art. For example, as illustrated in FIG. 12, insulating layer 40 is deposited over the surface of the substrate. Contact openings are made through the insulating layer to the underlying semiconductor devices, such as to the elevated source/drain 22. Since the source/drain junctions have the same height as the gate 36, plasma induced damage to the gate is greatly reduced. A metal layer 42 is deposited and patterned to form electrical connections between the elements of the integrated circuit. A passivation layer 44 completes the fabrication of the integrated circuit.

The process of the invention provides a MOSFET device with an elevated source/drain structure having reduced plasma induced damage to the gate. The elevated source/drain structure also eliminates junction consumption during silicidation.

While the invention has been particularly shown and described with reference to the preferred embodiments thereof, it will be understood by those skilled in the art that various changes in form and details may be made without departing from the spirit and scope of the invention.

What is claimed is:

1. A method of forming a MOSFET having an elevated source/drain structure in the fabrication of an integrated circuit device comprising:

providing a sacrificial oxide layer on a substrate;

depositing a polish stop layer overlying said sacrificial oxide layer;

depositing an oxide layer overlying said polish stop layer;

forming an opening through said oxide layer and said polish stop layer to said sacrificial oxide layer;

forming first polysilicon spacers on sidewalls of said opening wherein said first polysilicon spacers form said elevated source/drain structure;

forming second polysilicon spacers on said first polysilicon spacers;

removing said oxide layer and said sacrificial oxide layer exposed within said opening;

growing an epitaxial silicon layer within said opening;

forming a gate dielectric layer within said opening overlying said second polysilicon spacers and said epitaxial silicon layer;

depositing a gate material layer within said opening; and polishing back said gate material layer, said first polysilicon spacers and said second polysilicon spacers to said polish stop layer thereby completing formation of said MOSFET having an elevated source/drain structure in the fabrication of said integrated circuit device.

2. The method according to claim 1 wherein said polish stop layer comprises silicon nitride having a thickness of between about 100 and 1000 Angstroms.

3. The method according to claim 1 wherein said step of forming said first polysilicon spacers comprises:

depositing a first polysilicon layer overlying said oxide layer and said sacrificial oxide layer within said opening; and etching back said first polysilicon layer to leave said first polysilicon spacers only on sidewalls of said opening.

4. The method according to claim 3 wherein said first polysilicon layer is doped after said depositing step and prior to said etching back step.

5. The method according to claim 3 wherein said first polysilicon layer is in-situ doped.

6. The method according to claim 1 wherein said step of forming said second polysilicon spacers comprises:

depositing a second polysilicon layer overlying said oxide layer and said sacrificial oxide layer and said first polysilicon spacers within said opening; and etching back said second polysilicon layer to leave said second polysilicon spacers only on sidewalls of said first polysilicon spacers.

7. The method according to claim 6 wherein said second polysilicon layer is doped after said depositing step and prior to said etching back step.

8. The method according to claim 6 wherein said second polysilicon layer is in-situ doped.

9. The method according to claim 6 wherein said second polysilicon spacers form lightly doped source/drain extensions.

10. The method according to claim 1 wherein said epitaxial silicon layer is grown to a thickness of between about 10 and 500 Angstroms.

11. The method according to claim 1 wherein during said step of growing said epitaxial silicon layer, said first and second polysilicon spacers also increase in size.

12. The method according to claim 1 further comprising doping said epitaxial silicon layer for threshold voltage control.

13. The method according to claim 1 wherein said gate material layer is selected from the group consisting of: polysilicon and metals.

14. The method according to claim 1 wherein said polishing back step comprises chemical mechanical polishing.

15. A method of forming a MOSFET having an elevated source/drain structure in the fabrication of an integrated circuit device comprising:
   providing a sacrificial oxide layer on a substrate;
   depositing a polish stop layer overlying said sacrificial oxide layer;
   depositing an oxide layer overlying said polish stop layer;
   forming an opening through said oxide layer and said polish stop layer to said sacrificial oxide layer;
   forming first polysilicon spacers on sidewalls of said opening wherein said first polysilicon spacers form said elevated source/drain structure;
   forming second polysilicon spacers on said first polysilicon spacers wherein a portion of said sacrificial oxide is exposed between said second polysilicon spacers within said opening;
   removing said oxide layer and said sacrificial oxide layer exposed within said opening wherein said substrate is exposed within said opening;
   growing an epitaxial silicon layer within said opening and doping said epitaxial silicon layer for threshold voltage control;
   forming a gate dielectric layer within said opening overlying said second polysilicon spacers and said epitaxial silicon layer;
   depositing a gate material layer within said opening; and
   polishing back said gate material, said first polysilicon spacers and said second polysilicon spacers to said polish stop layer thereby completing formation of said MOSFET having an elevated source/drain structure in the fabrication of said integrated circuit device.

16. The method according to claim 15 wherein said polish stop layer comprises silicon nitride having a thickness of between about 100 and 1000 Angstroms.

17. The method according to claim 15 wherein said step of forming said first polysilicon spacers comprises:
   depositing a first polysilicon layer overlying said oxide layer and said sacrificial oxide layer within said opening; and
   etching back said first polysilicon layer to leave said first polysilicon spacers only on sidewalls of said opening.

18. The method according to claim 17 wherein said first polysilicon layer is doped prior to said etching back step and wherein a doping method is selected from the group consisting of in-situ doping and ion implantation.

19. The method according to claim 15 wherein said step of forming said second polysilicon spacers comprises:
   depositing a second polysilicon layer overlying said oxide layer and said sacrificial oxide layer and said first polysilicon spacers within said opening; and
   etching back said second polysilicon layer to leave said second polysilicon spacers only on sidewalls of said first polysilicon spacers.

20. The method according to claim 19 wherein said second polysilicon layer is doped prior to said etching back step and wherein a doping method is selected from the group consisting of in-situ doping and ion implantation.

21. The method according to claim 19 wherein said second polysilicon spacers form lightly doped source/drain extensions.

22. The method according to claim 15 wherein said epitaxial silicon layer is grown to a thickness of between about 10 and 500 Angstroms.

23. The method according to claim 15 wherein during said step of growing said epitaxial silicon layer, said first and second polysilicon spacers also increase in size.

24. The method according to claim 15 wherein said gate material layer is selected from the group consisting of: polysilicon and metals.

25. The method according to claim 15 wherein said polishing back step comprises chemical mechanical polishing.

26. A method of forming a MOSFET having an elevated source/drain structure in the fabrication of an integrated circuit device comprising:
   providing a sacrificial oxide layer on a substrate;
   depositing a polish stop layer overlying said sacrificial oxide layer;
   depositing an oxide layer overlying said polish stop layer;
   forming an opening through said oxide layer and said polish stop layer to said sacrificial oxide layer;
   depositing a first polysilicon layer overlying said oxide layer and said sacrificial oxide layer within said opening;
   etching back said first polysilicon layer to leave first polysilicon spacers only on sidewalls of said opening;
   depositing a second polysilicon layer overlying said oxide layer and said sacrificial oxide layer and said first polysilicon spacers within said opening;
   etching back said second polysilicon layer to leave said second polysilicon spacers only on sidewalls of said first polysilicon spacers wherein a portion of said sacrificial oxide is exposed between said second polysilicon spacers within said opening and wherein said second polysilicon spacers form lightly doped source/drain extensions;
   removing said oxide layer and said sacrificial oxide layer exposed within said opening wherein said substrate is exposed within said opening;
   growing an epitaxial silicon layer within said opening wherein said first and second polysilicon spacers also increase in size;
   doping said epitaxial silicon layer for threshold voltage control;
   thereafter forming a gate dielectric layer within said opening overlying said second polysilicon spacers and said epitaxial silicon layer;
   depositing a conducting layer within said opening; and
   polishing back said conducting layer, said first polysilicon spacers and said second polysilicon spacers to said polish stop layer wherein said conducting layer forms a gate electrode and said first polysilicon spacers form said elevated source/drain regions thereby completing formation of said MOSFET having an elevated source/drain structure in the fabrication of said integrated circuit device.

27. The method according to claim 26 wherein said polish stop layer comprises silicon nitride having a thickness of between about 100 and 1000 Angstroms.

28. The method according to claim 26 wherein said first polysilicon layer is doped prior to said etching back said first polysilicon layer and wherein a doping method is selected from the group consisting of in-situ doping and ion implantation.

29. The method according to claim 26 wherein said second polysilicon layer is doped prior to said etching back said second polysilicon layer and wherein a doping method is selected from the group consisting of in-situ doping and ion implantation.

30. The method according to claim 26 wherein said epitaxial silicon layer is grown to a thickness of between about 10 and 500 Angstroms.

31. The method according to claim 26 wherein said conducting layer is selected from the group consisting of: polysilicon and metals.

32. The method according to claim 26 wherein said polishing back step comprises chemical mechanical polishing.

* * * * *